United States Patent
Persson

[19]
[11] Patent Number: 5,821,811
[45] Date of Patent: Oct. 13, 1998

[54] BYPASS DEVICE IN AN AMPLIFIER UNIT

[75] Inventor: Lars Persson, Sollentuna, Sweden

[73] Assignee: Allgon AB, Akersberga, Sweden

[21] Appl. No.: 724,759

[22] Filed: Oct. 3, 1996

[30] Foreign Application Priority Data

Oct. 4, 1995 [SE] Sweden .................................. 9503443

[51] Int. Cl.[6] .................................................. H03F 3/189
[52] U.S. Cl. .............................. 330/51; 330/151; 330/286
[58] Field of Search .................................. 330/51, 53, 56, 330/57, 124 D, 151, 286

[56] References Cited

U.S. PATENT DOCUMENTS

| 4,780,685 | 10/1988 | Ferguson | 330/124 D |
| 4,910,478 | 3/1990 | Koyama | 330/51 X |
| 5,175,871 | 12/1992 | Kunkel | 330/51 X |

FOREIGN PATENT DOCUMENTS

| 0324381 | 7/1989 | European Pat. Off. . | |
| 55-49007 | 4/1980 | Japan | 330/286 |
| 2219702 | 12/1989 | United Kingdom . | |

WO91/19349 12/1991 WIPO .

*Primary Examiner*—James B. Mullins
*Attorney, Agent, or Firm*—Jacobson, Price, Holman & Stern, PLLC

[57] ABSTRACT

A bypass device in a low noise amplifier unit for amplifying communication signals in the microwave frequency range. The device includes a printed circuit board with transmission lines (1, 2), an amplifier (A), a transmission line bypass segment (3) extending in parallel to the amplifier, and switching means for activating said bypass segment in case the amplifier becomes inoperable. The amplifier is connected between two transmission line stub segments (4, 5). The switching means include solid state components (Z1, Z2, Z3, Z4) having a controllable impedance, either very low or very high, these components being connected to ground at selected points (3a, 3b, 4a, 4b) in the bypass segment (3) and in the stub segments (4, 5) so as to activate the bypass segment when all of said solid state component are in a state of very high impedance and to effectively cut off the bypass segment when all of said solid state components are controlled to a state of very low impedance, in which case the communication signals pass through the amplifier.

10 Claims, 1 Drawing Sheet

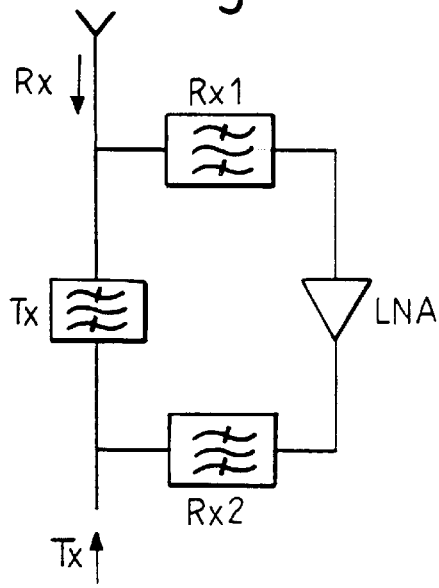
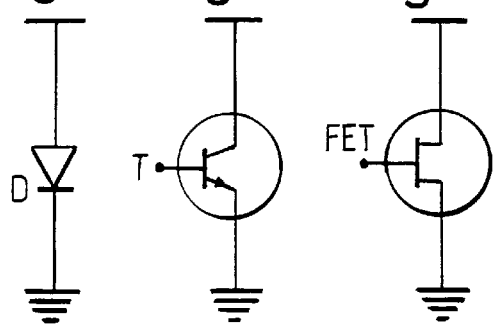
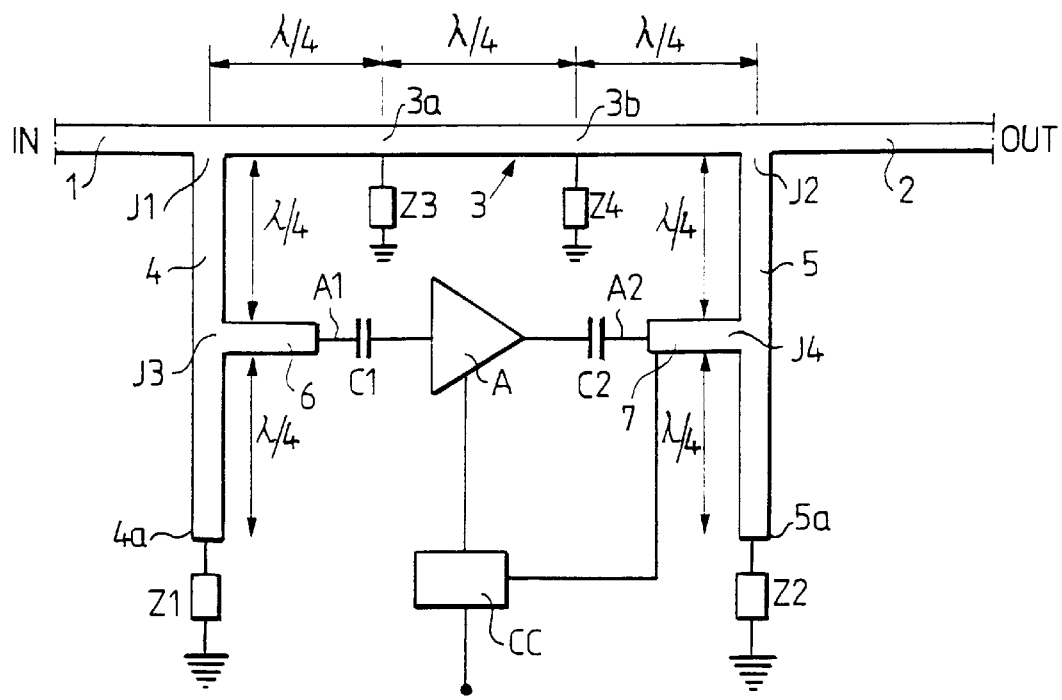

BYPASS DEVICE IN AN AMPLIFIER UNIT

FIELD OF THE INVENTION

The invention relates to a bypass device in an amplifier unit for amplifying communication signals in the frequency range from 500 MHz (including microwave frequencies), comprising a printed circuit board with transmission lines, an amplifier, a transmission line bypass segment extending in parallel to the amplifier, and switching means for activating said bypass segment in case the amplifier becomes inoperable.

BACKGROUND OF THE INVENTION

Such amplifier units are being used, e.g. in base stations for cellular mobile telephone systems. More particularly, in recent years, such amplifier units are mounted directly at the top of an antenna mast or tower, whereby the length of a transmission cable from the antenna can be minimized. Consequently, the signal-to-noise ratio can be maintained at a favourably high level, since the damping of the signal will be relatively low in the very short transmission cable.

However, of course, such an amplifier unit is a critical component in the overall system, and it is very important that it is operable at all times. Thus, even if the feeding power is interrupted or if the amplifier becomes inoperable for some other reason, the signal must be passed on somehow to the base station located adjacent to the bottom of the antenna mast or tower.

For this purpose, it is previously known to connect a bypass segment in parallel to the amplifier in combination with switching means in the form of an electromechanical relay, whereby the bypass segment is activated in case any of the amplifier transistors breaks down or the feeding power to the amplifier unit is interrupted.

Such electromechanical relays have a number of drawbacks. Although relatively small relays are now commercially available for mounting on printed circuit boards, they are relatively expensive and do not have satisfactory performance characteristics. Thus, the signal is attenuated to a large degree. Also, upon being switched off, the isolation is not sufficient. Moreover, the effective lifetime is not long enough.

SUMMARY OF THE INVENTION

Against this background, the primary object of the present invention is to provide a bypass device of the kind stated in the first paragraph, which is inexpensive and has an improved performance.

According to the invention, the amplifier is connected between two transmission line stub segments extending from two primary junction points, between which the bypass segment is connected, and the switching means comprise solid state components having a controllable impedance, either very low or very high, the solid state components being connected to RF-ground at selected points in the bypass segment and in the stub segments so as to activate the bypass segment when all of the solid state components are in a state of very high impedance and to effectively cut off the bypass segments when all of the solid state components are controlled to a state of very low impedance, in which case the communication signals pass through the amplifier. Solid state components for this purpose are easy to find and may be constituted e.g. by diodes or transistors.

Further advantageous features are contained in the dependent claims and will appear from the detailed description below.

The invention will now be described in more detail in connection with a preferred embodiment illustrated on the appended drawing.

BRIEF DESCRIPTION OF THE DRAWINGS

FIG. 1 shows schematically a simple circuit including an amplifier unit according to the invention;

FIG. 2 shows a portion of the amplifier unit with the major components and transmission line segments on a circuit card; and FIGS. 3a, 3b and 3c illustrate various possible embodiments of a solid state component included in the amplifier unit.

DETAILED DESCRIPTION OF A PREFERRED EMBODIMENT

The circuitry shown in FIG. 1 is a duplex arrangement connected to an antenna. Typically, the antenna, the duplex circuitry with band pass filters Rx1, Rx2 and Tx as well as a low noise amplifier LNA are mounted at the top of a mast or a tower included in a cellular mobile telephone system. Normally, adjacent to the bottom of the tower, there is a base station with various equipment for maintaining and monitoring the operation of the base station, including receiving and transmitting communication signals at relatively high frequencies, such as 1.9 GHz.

As indicated above, the low noise amplifier LNA has the task of amplifying received communication signals before these signals become significantly attenuated along the transmission line.

The amplifier unit is contained within a weather-proof casing (not shown on the drawing) and includes a printed circuit board, a portion of which is shown schematically in FIG. 2, with transmission lines 1, 2, an amplifier A, possibly in the form of two parallel branches each including an amplifier and possibly one or more cascaded amplifiers, between two coupling capacitors C1 and C2, and a transmission line bypass segment 3 extending in parallel to the amplifier A. In accordance with the invention, the amplifier A is connected between two transmission line stub segments 4 and 5 extending from two primary junction points J1 and J2, respectively. In the illustrated example, each stub segment 4, 5 has a length corresponding to a half wavelength of the particular signal frequency being received and filtered by the band pass filter Rx1 (FIG. 1).

At the midpoint of each stub segment 4, 5 there is a secondary junction point J3 and J4, respectively, which is thus situated at a distance of a quarter wavelength from the respective junction point J1, J2 and from the respective free end 4a, 5a of the stub segment. The input and output terminals A1, A2 of the amplifier A are connected to the respective junction points J3, J4 via relatively short transmission line segments 6 and 7, respectively.

The free end 4a, 5a of each stub segment is connected to ground via a solid state component Z1 and Z2, respectively. Likewise, there are similar solid state components Z3 and Z4 connected between the ground and selected points 3A, 3B at the bypass segment 3.

The solid state components Z1, Z2, Z3 and Z4 may be constituted by diodes D, bipolar transistors T or field effect transistors FET as indicated in FIGS. 3a, 3b and 3c, respectively. In any case, each such component may be switched from a state of very high impedance, such as at least 500Ω, and a state of very low impedance, such as less than 1Ω. The switching between these two distinct states is easily accomplished by applying a biassing DC voltage on the diode D, on the base of the bipolar transistor T or on the control gate of the field effect transistor FET.

Such a controlled switching can be accomplished by a control circuit CC being located either within the amplifier unit, as illustrated in FIG. 2, or at the base station along with other equipment.

In order to obtain the desired switching function, it is necessary to carefully match the various transmission line segments in such a way that the bypass segment 3 becomes active when all the solid state components are in a state of high impedance, whereas the bypass segment is cut off and the signal is passed through the amplifier A when all the solid state components Z1–Z4 are biassed to a state of low impedance. In order to achieve this, the distance between the junction points J1 and J3 must be a quarter wave length, or a number of half wave lengths added thereto. The same is true for the distance between the junction points J2 and J4, the junction point J3 and the end point 4a, the junction point J4 and the end point 5a, the junction point J1 and the point 3a, the junction point J2 and the point 3b, and the distance between the points 3a and 3b. Alternatively, the points 3a and 3b can be located together.

In order to improve the isolation in the bypass segment when it is switched off, it is possible to add more solid state components in the bypass segment, with a distance of $\lambda/4$ between each component.

The length of each stub and the other distances corresponding to quarter or half wave lengths differ somewhat from the exact wave length values so as to compensate for the fact that the solid state components are not ideal.

With such a configuration, the device will operate as follows: Suppose that all the solid state components Z1–Z4 are in a state of high impedance, which is the case when there is no controlling DC voltage applied to the components. Then, the end points 4a, 5a of the stub segments 4, 5 will be equivalent to open ends, so there will be a standing wave in each stub segment without conducting any signal current therethrough.

Thus, at the junction points J1 and J2 the incoming signal will sense a very high impedance. Consequently, the signal will propagate straight through the bypass segment 3, since the solid state components Z3 and Z4 have no influence either because of their very high impedance. The signal will not pass through the amplifier in this situation.

Now, consider the ordinary situation where a DC control voltage is applied to all the solid state components Z1–Z4. These components now have a very low impedance. In point 3a in the bypass segment 3, there will virtually be a short circuit to the component Z3. Consequently, the impedance of the bypass segment 3, as seen at the junction point J1, will be very high, so the incoming signal will instead follow the route through the stub segment 4 up to the junction point J3 and then through the amplifier A, the other stub segment 5 and out through the transmission line 2. At the junction point J3, the impedance of the component Z1 is very high because of the quarter wave distance to the end point 4a, where the impedance is very low.

In case of a power failure, the biassing voltage will drop, and the system will be switched to the bypass configuration without amplifying the incoming signal. Preferably, the control circuit CC is adapted to monitor the proper operation of the amplifier A. In case of inoperability for one reason or another, the control circuit CC will then apply a switching signal to the solid state components Z1–Z4.

The bypass device described above has many advantages. In the bypass configuration, the losses will be very low, since no solid state component will be located in series with the signal route. Also, during normal operation of the device, the isolation of the bypass segment by way of the components Z3 and Z4 is very effective and also the losses to the amplifier will be very low. Moreover, the solid state components are inexpensive and can be mounted automatically onto a standard circuit card.

The device may be modified within the scope defined by the appended claims. For example, the amplifier unit does not have to be included in a duplex configuration, but can be mounted in a simplex system, where the amplifier is connected in series with a band pass filter to a receiving antenna.

I claim:

1. Bypass device in an amplifier unit for amplifying communication signals in the frequency range from 500 MHZ, comprising a printed circuit board with transmission lines, an amplifier, a transmission line bypass segment extending in parallel to the amplifier, and switching means for activating said bypass segment in case the amplifier becomes inoperable, characterized in that said amplifier is connected between two transmission line stub segments extending from two primary junction points, between which said bypass segment is connected, and in that said switching means comprises solid state components having a controllable impedance, either very low or very high, said solid state components connected to ground at selected points of said bypass segment and of said stub segments so as to enable switching between a normal operational state and a bypass state, wherein, in the normal operational state, all of said solid state components are controlled into a state of very low impedance, so that the bypass segment is effectively blocked and the communication signals pass via said stub segments, through the amplifier, whereas, in the bypass state, all of said solid state components are controlled into a state of very high impedance, so that the stub segments are effectively blocked and the communication signals pass through said bypass segment.

2. The bypass device as defined in claim 1, wherein each stub segment has a length corresponding substantially to a half wavelength, added with a number of whole wavelengths ($\lambda/2+n\cdot\lambda$, where n=0, 1, 2, . . . ), the amplifier input and output terminals being connected to secondary junction points located at the mid point of each stub segment at a distance of a quarter wavelength, added with a number of half wavelengths ($\lambda/4+n\cdot\lambda/2$, where n=0, 1, 2, . . . ), from the associated primary junction point and from the free end point of the respective stub segment, one of said solid state components being connected to said free end point of the respective stub segment.

3. The bypass device as defined in claim 1, wherein at least one of said solid state components is connected to said bypass segment at a point located at a distance of a quarter wavelength, added with a number of half wavelengths ($\lambda/4+n\cdot\lambda/2$, where n=0, 1, 2, . . . ), from an associated one of said primary junction points.

4. The bypass device as defined in claim 3, wherein at least two solid state components are connected to the bypass segment, each at a distance of a quarter wavelength from an associated primary junction point and at a mutual distance of a quarter wavelength, these distances being added with a number of half wavelengths ($\lambda/4+n\cdot\lambda/2$, where n=0, 1, 2, . . . ).

5. The bypass device as defined in claim 1, wherein a control unit is adapted to feed DC current to the amplifier as well as to all of said solid state components.

6. The bypass device as defined in claim 5, wherein said control unit is adapted to monitor the operability of the amplifier and to switch all of said solid state components into a state of very high impedance in case the amplifier becomes inoperable.

7. The bypass device as defined in claim 1, wherein at least one of said solid state components is a diode.

8. The bypass device as defined in claim 1, wherein at least one of said solid state components is a transistor.

9. The bypass device as defined in claim 8, wherein said transistor is a bipolar transistor.

10. The bypass device as defined in claim 8, wherein said transistor is a field effect transistor.

* * * * *